United States Patent
Bailey et al.

(10) Patent No.: US 7,288,951 B1
(45) Date of Patent: Oct. 30, 2007

(54) BURN-IN SYSTEM HAVING MULTIPLE POWER MODES

(75) Inventors: Philip Alan Bailey, Marine on St. Croix, MN (US); Kevin Roland Deters, Coon Rapids, MN (US)

(73) Assignee: Micro Control Company, Fridley, MN (US)

( * ) Notice: Subject to any disclaimer, the term of this patent is extended or adjusted under 35 U.S.C. 154(b) by 0 days.

(21) Appl. No.: 11/602,091

(22) Filed: Nov. 20, 2006

(51) Int. Cl.
*G01R 31/02* (2006.01)

(52) U.S. Cl. .................................... 324/760

(58) Field of Classification Search ............. 324/760, 324/765, 158.1, 763
See application file for complete search history.

(56) References Cited

U.S. PATENT DOCUMENTS 7,053,648 B2 * 5/2006 DeVey ................ 324/765
7,190,184 B2 * 3/2007 Haji-Sheikh et al. ....... 324/760

* cited by examiner

*Primary Examiner*—Minh N. Tang
*Assistant Examiner*—Tung X. Nguyen
(74) *Attorney, Agent, or Firm*—Westman, Champlin & Kelly, P.A.

(57) ABSTRACT

A burn-in system includes single and dual power modes, a testing stage, first and second power stages, a single mode power control circuit and a dual mode power control circuit. When the burn-in system is in the single power mode, the first power stage produces a first power output to the testing stage based on a single mode error signal generated by the single mode power control circuit. When the burn-in system is in the dual power mode the first power stage produces the first power output and the second power stage produces a second power output in response to a dual mode error signal produced by the dual mode power control circuit. The first and second power outputs are coupled together when the burn-in system is in the dual power mode. In one embodiment, the first and second power stages each include a pulse width modulator controller that receives one of the error signals produced by the single mode and dual mode power control circuits depending on the power mode of the burn-in system, and controls the first and second power outputs accordingly.

14 Claims, 11 Drawing Sheets

BURN-IN SYSTEM HAVING MULTIPLE POWER MODES

FIELD OF THE INVENTION

Embodiments of the present invention generally relate to "burn-in" systems that stress test electronic components. More particularly, embodiments of the present invention relate to burn-in systems having multiple modes of supplying power to a testing stage of the burn-in system where the stress testing of electronic components, such as integrated circuit chips, is conducted.

BACKGROUND OF THE INVENTION

Electronic components, such as silicon integrated circuit chips or other electronic components, are subject to early failure during their life cycle. It is desirable to detect and eliminate the chips that are most prone to early failure prior to sending them to market. Additionally, it is desirable to identify the components of the chips that cause the early failures so that they may be improved. Thus, producers of these electronic components have found it cost-effective to utilize burn-in systems to rigorously temperature stress the integrated circuit chips while simultaneously powering them in order to detect under-performing chips.

Burn-in systems typically utilize burn-in boards to support a number of electronic components to be tested inside a burn-in oven. An exemplary burn-in oven 100, shown in FIG. 1, is typically configured to hold several racks of burn-in boards 102. Each burn-in board 102 typically includes multiple sockets 104 for holding integrated circuit chips or electronic devices 106 (hereinafter "chips") that are to be stress tested, as illustrated in the schematic diagram of a burn-in system provided in FIG. 2.

The chips 106 on the burn-in board 102 are powered and exposed to heat stress over an extended period of time. During burn-in temperature stressing of the chips, heat exchange systems 108 are employed to maintain the chips within a desired temperature range to prevent overheating of the chips, which can damage properly functioning chips.

Burn-in systems also include one or more power stages 110 that are used to supply a desired power 111 to a testing stage 112 of the burn-in board 102, as illustrated in FIG. 2. The testing stage 112 handles the application of the power 111 supplied from the power stage 110 to the integrated circuit chips 106 being tested. Multiple power stages can be used to simultaneously supply power to the testing stage when the amount of power supplied by a single power stage is insufficient.

An exemplary power stage 110 in accordance with the prior art is illustrated schematically in FIG. 3. The power stage 110 includes one or more power supplies 116 that provide bulk power 118 for the power stage 110. A pulse width modulator (PWM) 120 modulates the bulk power 118 in response to a control signal 122 from a pulse width modulator controller 124 to control the power that is supplied to the testing stage 112.

It is important to control the voltage across the chips 106 or the electrical testing "load" 126 of the testing stage 112, during stress testing to ensure that the specifications of the test being conducted are met. For example, if the voltage across the testing load 126 is not in accordance with the specifications of the test, the testing results will be unreliable. Unfortunately, the task of maintaining the voltage across the load 126 at a desired level is made difficult by the fact that the load 126 will vary due to temperature changes in the chips and other factors over the course of a stress test.

Voltage control circuits, such as voltage control circuit 130 shown in FIG. 3, have been used to ensure that the desired voltage, or target load voltage 132, is applied across the load 126 of the testing stage 112 during chip stress testing. The voltage control circuit 130 generally operates by measuring the voltage across the load 126 of the testing stage 112 and comparing that measured load voltage 134 to the target load voltage 132. The difference between the measured load voltage 134 and the target load voltage 132 indicates an error, which is fed from the voltage control circuit 130 to the pulse width modulator controller 124 as a voltage error signal 136. The pulse width modulator controller 124 generates the control signal 122, based on the voltage error signal 136, that controls the pulse width modulator 120 to adjust the power 111 supplied to the power stage 112 as needed to change the measured load voltage 134 to the target load voltage 132. In this manner the voltage across the testing load 126 is maintained at the desired level.

The stress testing of high performance integrated circuit chips typically requires the application of high power to the resultant load 126 of the testing stage 112. This high power demand places a heavy demand on the power supply 116 of the power stage 110. In particular, as the load 126 of the testing stage 112 increases, the current supplied to the testing stage 112 from the power stage 110 must increase in order to maintain the desired target load voltage 132 across the testing load 126. Occasionally, the demand for current exceeds the capability of the power supply 116. In order to avoid damaging the power supply 116, various protection methods have been employed.

One protection method incorporated by prior art burn-in systems shuts down the pulse width modulator controller 124 and thus the pulse width modulators 120 when a current limit of the measured load current 142 is exceeded. Unfortunately, this protection method results in undesired interruptions to the stress testing of the chips.

In an effort to avoid interrupting ongoing chip stress testing, power protection has been provided to power stages 110 using a current control circuit 140 (FIG. 3) that operates discretely from the voltage control circuit 130 described above to prevent the current output from the power stage 110 to the testing stage 112 from exceeding preset current limits. The current control circuit 140 operates in a manner that is similar to the voltage control circuit 130 by measuring the current fed to the load 126 of the testing stage 112 with a current shunt 141, comparing this measured load current 142 to a target load current 144 and outputting a current error signal 146 that is related to the difference between the measured load current 142 and the target load current 144. The current error signal 146 produced by the current control circuit 140 is coupled to the voltage error signal 136.

When the power stage 110 provides a current to the testing stage that is less than the target load current 144, the power stage 110 operates in a "voltage control" mode, in which the control signal 122 to the pulse width modulator 120 is substantially independent of the current error signal 146 and substantially dependent on the voltage error signal 136. In other words, the control signal 122 received by the pulse width modulator 120 is substantially based on the difference between the measured load voltage 134 and the target load voltage 132.

However, when the power stage 110 provides a current (i.e., measured load current 142) to the testing stage 112 that exceeds the target load current 144, the power stage 110 switches from the voltage control mode to a "current control" mode, in which the control signal 122 received by the pulse width modulator 120 is substantially independent of the voltage error signal 136 and substantially dependent on the current error signal 146. In other words, the control signal 122 received by the pulse width modulator 120 is substantially based on the difference between the measured load current 142 and the target load current 144. While in the current control mode, the current output from the power stage 110 is reduced to a value that is equal to the target load current 144 regardless of the target and measured load voltages 132 and 134.

One problem with the arrangement depicted in FIG. 3 is that the switching between the voltage control mode and the current control mode produces a transient error in the signal to the pulse width modulator controller 124 for a period of time before it settles to a stable and useable signal. As a result, there is a delay in the switching between the voltage and current control modes. This delay limits the high power testing capability of the burn-in board 102 because the target or maximum load current level 144 must be reduced in order to ensure that the current limit of the power stage 110 is not exceeded.

Additionally, the modulated power output 111 produced by the power stage 110 typically comprises an errant voltage during transitions between the voltage and current control modes, which can affect the accuracy of the testing.

As mentioned above, multiple power stages 110 (FIG. 2) can be used to simultaneously supply power to the testing stage 112 when the amount of power supplied by a single power stage is insufficient. In general, the power outputs of one or more of the power stages 110 are coupled together to increase the power supplied to the testing stage 112, as illustrated by the dashed lines in FIG. 2. When the burn-in system is operating in such a multiple power mode, it is desirable to control the power supplied by the power stages 110 using a single set of voltage and current control circuits.

Unfortunately, the voltage and current control circuits used to control a single power stage (i.e., single power mode) are different from the voltage and current control circuits that are required to control a combination of two power stages (i.e., dual power mode) where the power outputs of two power stages 110 are combined. In general, each different power mode of the burn-in system (i.e., single, dual, triple, quad, etc.) requires different voltage and current control circuits.

There is a continuous demand for improvements to burn-in systems including, for example, more seamless switching between current and voltage control modes of the power stage and easier setup of the burn-in system power mode.

Embodiments of the present invention provide solutions to these and other problems, and offer other advantages.

SUMMARY OF THE INVENTION

The present invention is directed to a burn-in system configured to stress test integrated circuits having multiple power modes. In general, the burn-in system includes multiple power stages and multiple power control circuits that are configured to control the power stages during various power modes of operation.

In one embodiment, the burn-in system includes single and dual power modes, a testing stage, first and second power stages, a single mode power control circuit and a dual mode power control circuit. When the burn-in system is in the single power mode, the first power stage produces a first power output to the testing stage based on a single mode error signal generated by the single mode power control circuit. When the burn-in system is in the dual power mode the first power stage produces the first power output and the second power stage produces a second power output in response to a dual mode error signal produced by the dual mode power control circuit. The first and second power outputs are coupled together when the burn-in system is in the dual power mode. In one embodiment, the first and second power stages each include a pulse width modulator controller that receives one of the error signals produced by the single mode and dual mode power control circuits depending on the power mode of the burn-in system, and controls the first and second power outputs accordingly.

Another embodiment of the burn-in system includes a testing stage configured to stress test an integrated circuit, a first power stage, a second power stage, a first single mode power control circuit and a first dual mode power control circuit. The first power stage includes a first pulse width modulator controller having a first error input and a first pulse width modulator. The first pulse width modulator controller is configured to produce a first control signal in response to a signal received at the first error input. The first pulse width modulator is configured to produce a first power output in response to the first control signal.

The second power stage includes a second pulse width modulator controller having a second error input and a second pulse width modulator. The second pulse width modulator controller is configured to produce a second control signal in response to a signal received at the second error input. The second pulse width modulator is configured to produce a second power output in response to the second control signal.

The first single mode power control circuit includes a current control circuit and a voltage control circuit. The current control circuit is configured to generate a first single mode current error signal based on a first measured load current, which is indicative of the current supplied by the first power output. The voltage control circuit is coupled to the first single mode current error signal and is configured to generate a first single mode voltage error signal.

The first dual mode power control circuit includes a current control circuit and a voltage control circuit. The current control circuit is configured to generate a first dual mode current error signal based on the first measured load current and/or a second measured load current, which is indicative of the current supplied by the second power output. The voltage control circuit is coupled to the first dual mode current error signal and is configured to generate a first dual mode voltage error signal.

When the burn-in system is in a single power mode, the first single mode voltage error signal is coupled to the first error input and the first power output is coupled to the testing stage. When the burn-in system is in a dual power mode, the first dual mode voltage error signal is coupled to the first and second error inputs, and the first and second power outputs are coupled together and to the testing stage.

Other features and benefits that characterize embodiments of the present invention will be apparent upon reading the following detailed description and review of the associated drawings.

DETAILED DESCRIPTION OF ILLUSTRATIVE EMBODIMENTS

Embodiments of the present are directed to a burn-in system having multiple power stages that can operate alone or in combination with each other to supply power to a testing stage of the burn-in system. The testing stage utilizes the power supplied from the power stages to conduct stress testing of integrated circuit chips or electronic devices, as described above. The burn-in system also includes multiple power control circuits that are each configured to control the power generated by either an individual power stage or multiple power stages whose power outputs are coupled together.

Power Stage and Power Control Circuit Operation

Figure 4:
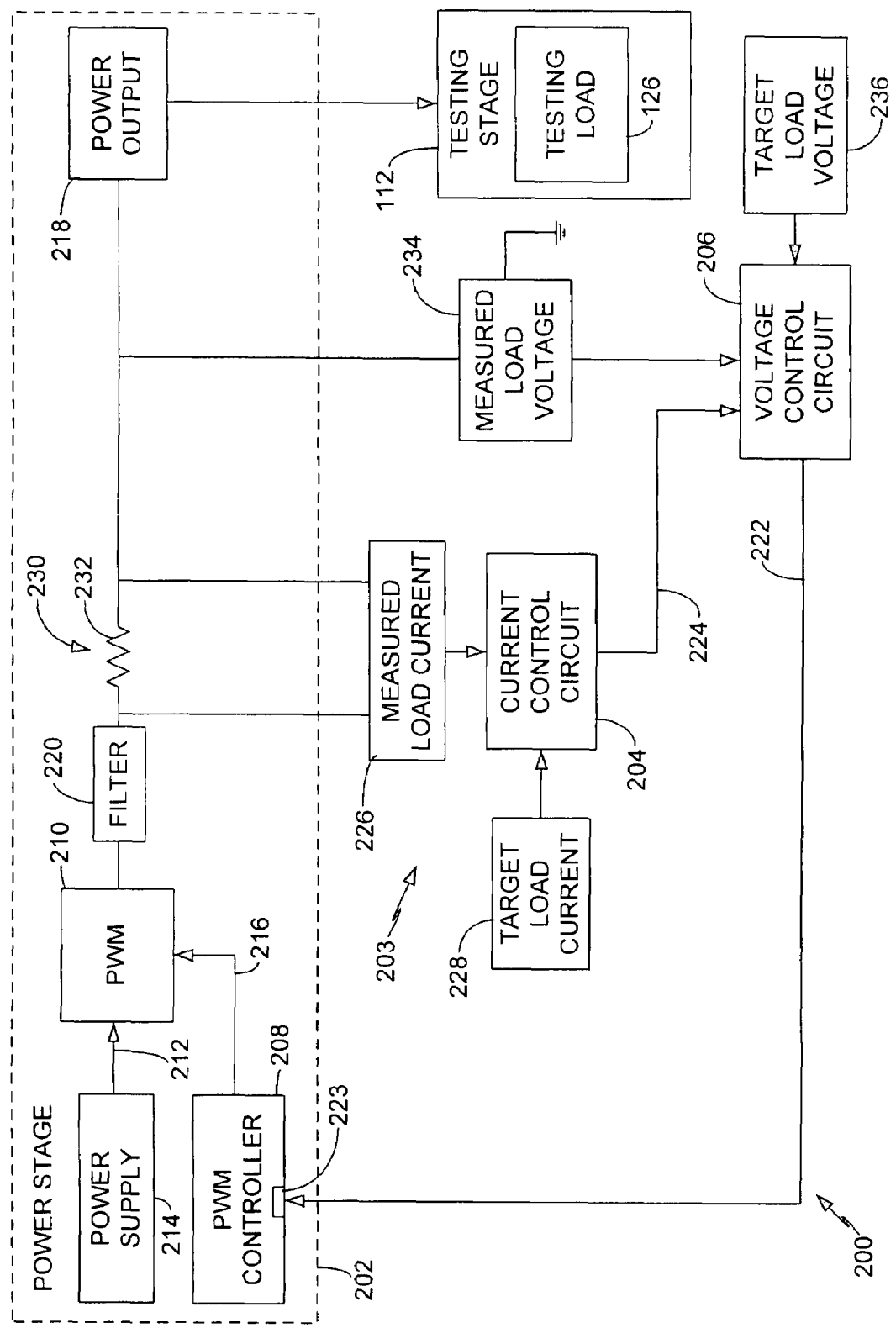
FIG. 4 is a schematic diagram of a burn-in system in accordance with embodiments of the invention.

FIG. 4 is a schematic diagram of a burn-in system 200 that includes a power stage 202 in accordance with embodiments of the invention that provides power to the testing stage 112 described above. As will be discussed in greater detail below, the power stage 202 can be one of several power stages of the burn-in system 200 that can operate independently, such as depicted in FIG. 4, or in combination with each other to provide the desired power to the testing stage 112. Thus, the burn-in system 200 includes multiple power modes that are each based on the manner in which the individual power stages are used.

In one embodiment, each power mode of the burn-in system 200 is controlled by a dedicated power control circuit 203 that includes a current control circuit 204 and a voltage control circuit 206. The power control circuit 203 switches between voltage and current control modes of operation that are determined based on signals from its current and voltage control circuits 204 and 206.

In one embodiment, each power stage 202 includes a pulse width modulator (PWM) controller 208, a pulse width modulator 210. The pulse width modulator 210 modulates a bulk power output 212 from a power supply 214 based on a control signal 216 generated by the pulse width modulator controller 208 to produce a modulated power output 218. In general, the bulk power output 212 is modulated in accordance with a duty cycle that is set by the control signal 216 from the pulse width modulator controller 208 to form the modulated power output 218. A filter 220 can be used to convert the modulated power output 218 into the direct current form generally used by the testing stage 112.

An exemplary pulse width modulator controller 208 that is suitable for use in the power stages 202 is the LTC3731 controller manufactured by Linear Technology Corporation. The LTC3731 includes an internal error voltage amplifier and protection circuitry. These are disabled by connecting the appropriate input (i.e., EAIN input) to an appropriate voltage so that there is a single control input to the pulse width modulator controller 208.

Figure 3:
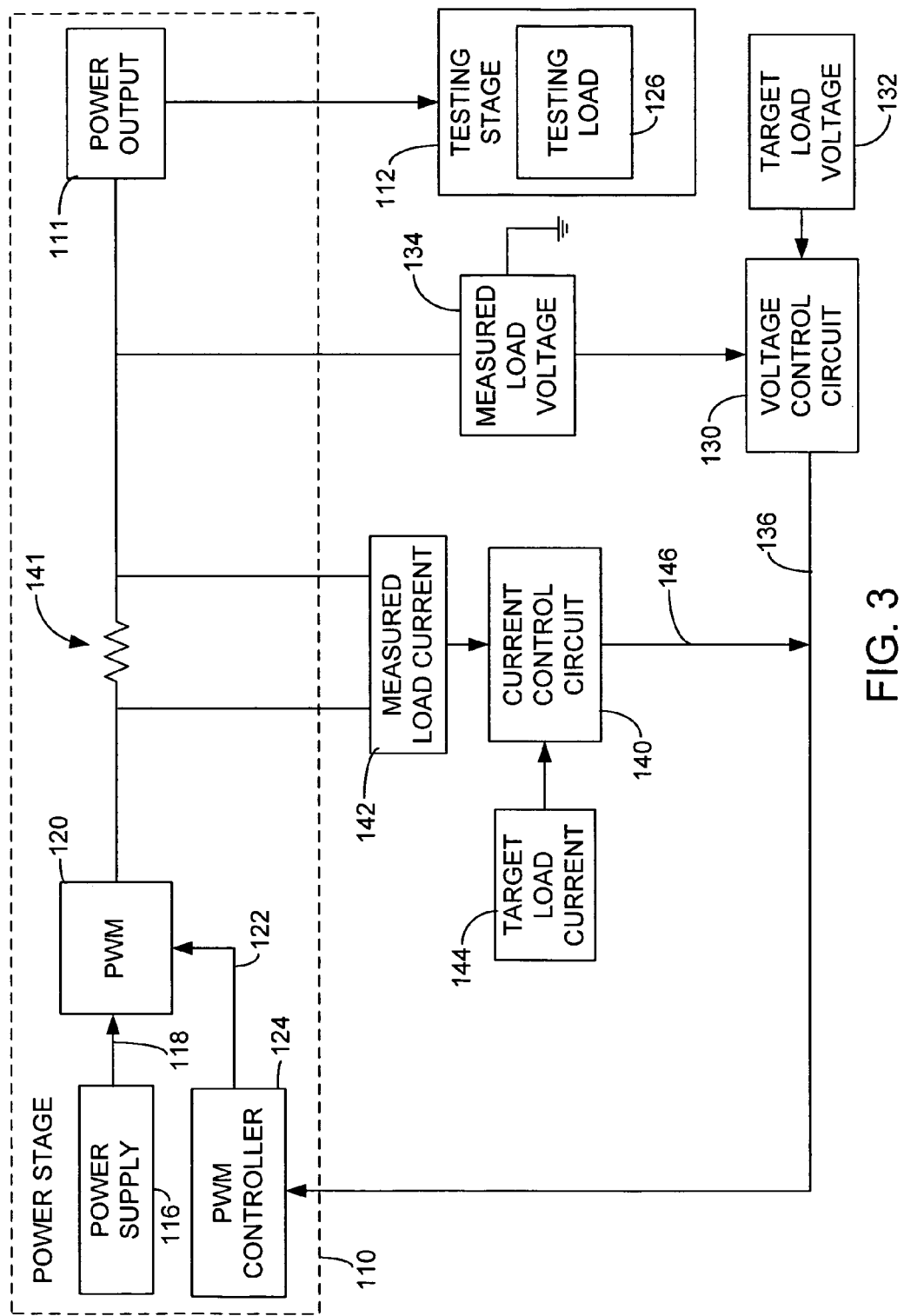

As discussed above with reference to FIG. 3, conventional burn-in system power stages generate the modulated power output based on either the voltage error output signal 136 (when the power stage is in the voltage control mode) or the current error output signal 146 (when the power stage is in the current control mode). Embodiments of the invention include the generation of the control signal 216 by the pulse width modulator controller 208 based on a voltage error output signal 222 from the voltage control circuit 206 that is received at an error input 223, during both voltage and current control modes of operation of the power stage 202. As a result, embodiments of the invention include the generation of the modulated power output 218 by the pulse width modulator 210 based on the voltage error output signal 222 during both voltage and current control modes of operation of the power stage 202.

One embodiment of current control circuit 204 is configured to produce a current error output signal 224 that is based on a difference between a measured load current 226 and target load current 228. The measured load current 226 is indicative of the current that is being supplied to the testing stage 112 by the modulated power output 218 produced by the pulse width modulator 210. In one embodiment, the measured load current 226 is obtained from a current shunt 230, which is a low value resistor that is in line with the modulated power output 218. The voltage across the resistor 232 is indicative of the current to the testing stage 112. Other methods can also be employed to obtain the measured load current 226.

The target load current 228 indicates the desired maximum current that is to be supplied by the power stage 202 to the testing stage 112. Typically, the target load current 228 is set to a value based on the current limits of the power stage 202. In one embodiment, the target load current 228 is a voltage that indicates the desired maximum load current that is to be produced by the power stage 202.

Embodiments of the voltage control circuit 206 are configured to produce the voltage error output signal 222 that is dependent on whether the power stage 202 is in a voltage control mode or a current control mode. In one embodiment, the particular mode of operation of the power stage 202 is dependent on the difference between the measured load current 226 and the target load current 228. When the measured load current 226 is less than the target load current 228, the power stage 202 operates in the voltage control mode. When the measured load current 226 exceeds the target load current 228, the power stage 202 operates in the current control mode and clamps the current to the testing stage (i.e., power output 218) to a level that is equal to the target load current 228, in accordance with one embodiment of the invention.

When in the voltage control mode, the voltage error output signal 222 is based on a difference between a measured load voltage 234 and a target load voltage 236. The measured load voltage 234 is indicative of the voltage across the testing load 126 of the testing stage 112, and the target load voltage 236 is the voltage that is set to a value that is indicative of the desired voltage across the testing load 126.

In accordance with one embodiment, when the power stage 202 is in the current control mode, the voltage error output signal 222 is produced by the voltage control circuit based on the current error output signal 224 from the current control circuit 204. In one embodiment, the voltage error output signal 222 is produced by the voltage control circuit 206 based on the current error output signal 224 and the measured load voltage 234. Alternatively, the voltage error output signal 222 can be produced by the voltage control circuit 206 based on the current error output signal 224 and the target load voltage 236.

In one embodiment, the control input of the pulse width modulator controller 208 is coupled to the voltage error output signal 222 and produces the control signal 216 based on the voltage error output signal 222. Accordingly, the control signal 216 produced by the pulse width modulator controller 208 is based on a difference between the measured load voltage 234 and the target load voltage 236 when the power stage 202 is in the voltage control mode, and the control signal 216 produced by the pulse width modulator controller 208 is based on the current error output signal 224 from the current control circuit 204 when the power stage 202 is in the current control mode. Thus, the control signal 216 is based on the difference between the measured load current 226 and the target load current 228, when the power stage 202 is in the current control mode.

Exemplary Power Control Circuit

Figure 5:
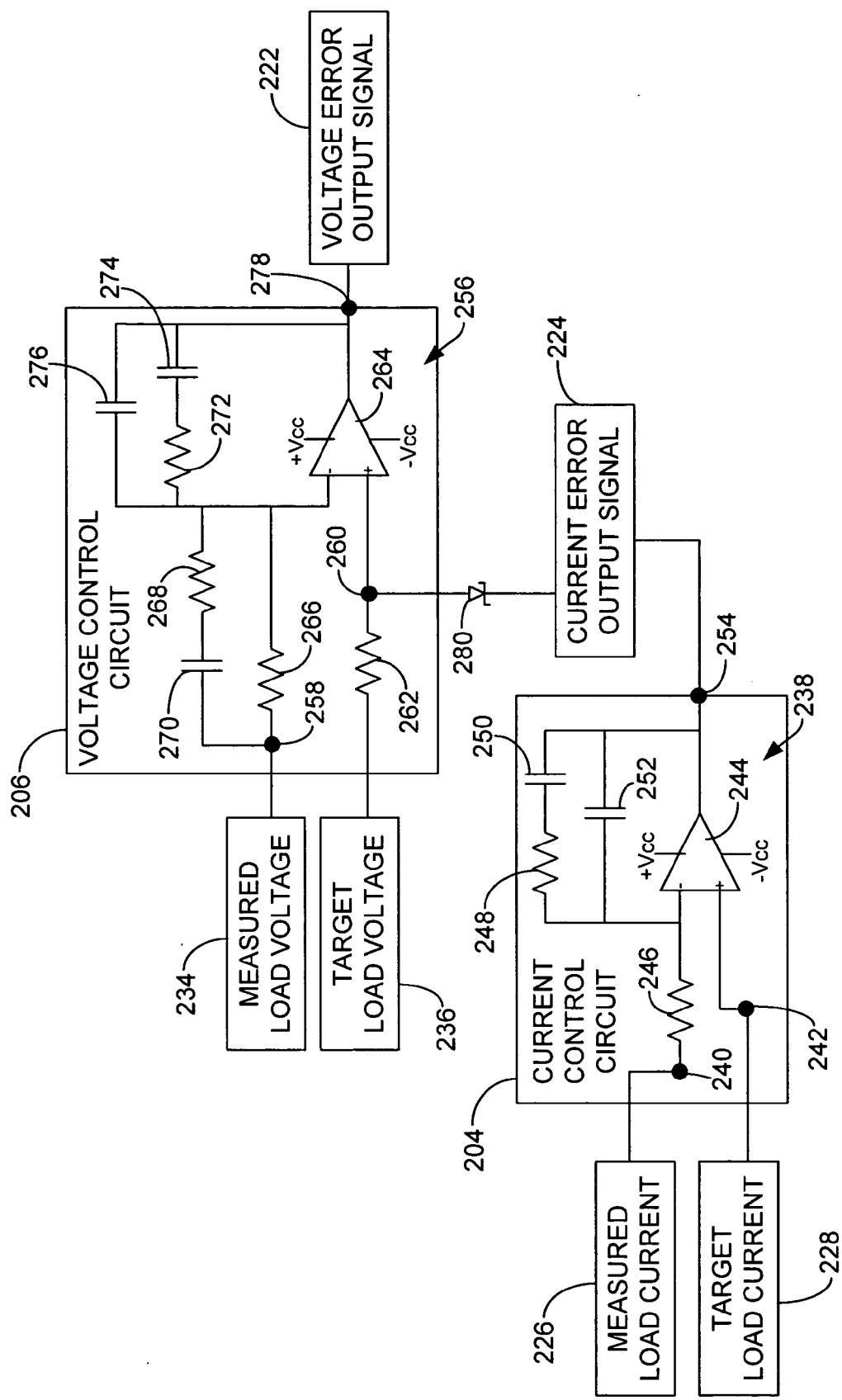
FIG. 5 is a circuit diagram of current and voltage control circuits of a power stage of a burn-in system in accordance with embodiments of the invention.

FIG. 5 illustrates an exemplary power control circuit 203 that comprises current and voltage control circuits 204 and 206, in accordance with embodiments of the invention. Those skilled in the art understand that other current control circuit and voltage control circuit designs can be utilized and modifications can be made without departing from the spirit and scope of the invention.

In addition to the overall designs of the current and voltage control circuits, the exemplary values of the resistors, capacitors and other elements of the circuits provided below can be set to "tune" them based on the power mode of the burn-in system (i.e., the number of power stages 202 being controlled) and the desired responsiveness of the circuits, as understood by those skilled in the art. The exemplary values for the resistors and capacitors of the voltage and current control circuits described below correspond to a power control circuit used during a single power mode of operation, in which only one power stage is used to supply power to the testing stage.

One exemplary embodiment of the current control circuit 204 comprises a current error amplifier 238 that includes a first input 240 that is coupled to the measured load current (a voltage) 226 and a second input 242 that is coupled to the target load current (a voltage) 228. The first input 240 of the current error amplifier 238 is coupled to the inverting input of an operational amplifier 244 through a resistor 246 (e.g., 3.57 k ohms), and the second input 242 of the current error amplifier 238 is coupled to the non-inverting input of the operational amplifier 244. The exemplary current error amplifier 238 includes alternating current (AC) coupled feedback between the output and the inverting input of the operational amplifier 244 that includes resistor 248 (e.g., 10 k ohms) and capacitors 250 and 252 (e.g., 8200 pF and 820 pF).

The current error amplifier 238 generates the current error output signal (a voltage) 224 at the output 254 that will increase or decrease non-linearly with the difference between the voltages at the inverting and non-inverting inputs of the operational amplifier 244, which corresponds to the difference between the measured load current 226 and the target load current 228. Thus, the current error output signal 224 is indicative of the difference between the measured load current 226 and the target load current 228.

If the measured load current 226 at the first input 240 is less than the target load current 228 at the second input 242, the voltage of the current error output signal 224 will increase until the measured load current 226 and the target load current 228 substantially equalize, then maintain that level provided that the target load voltage has not been exceeded. Accordingly, while the measured load current 226 is less than the target load current 228, the voltage of the current error output signal 224 will remain at a "high" voltage level.

On the other hand, if the measured load current 226 at the first input 240 is greater than the target load current 228 at the second input 242, then the voltage of the current error output signal 224 will decrease until the measured load current 226 and the target load current 228 substantially equalize, then maintain that level. Thus, while the measured load current 226 exceeds the target load current 228, the voltage of the current error output signal 224 will remain at a "low" voltage level.

One exemplary embodiment of the voltage control circuit 206 includes a voltage error amplifier 256 that includes a first input 258 coupled to the measured load voltage 234 and a second input 260 coupled to the target load voltage 236 through a resistor 262 (e.g., 1.5 k ohms). The first input 258 of the voltage control circuit 256 is coupled to the inverting input of an operational amplifier 264 through a resistor 266 (e.g., 3.57 k ohms) and AC coupled through a resistor 268 (e.g., 390 ohms) and a capacitor 270 (e.g., 8200 pF). The second input 260 of the voltage control circuit 206 is coupled to the non-inverting input of the operational amplifier 264. The exemplary voltage error amplifier 256 includes AC coupled feedback between the output and the inverting input of the operational amplifier 264 that includes a resistor 272 (e.g., 4.12 k ohms), a capacitor 274 (8200 pF) and a capacitor 276 (e.g., 1000 pF).

The voltage error amplifier 256 generates the voltage error output signal (a voltage) 222 at an output 278 of the operational amplifier 264 that will increase or decrease non-linearly with the difference between the voltages at the inverting and non-inverting inputs of the operational amplifier 264. In general, if the voltage at the inverting input of the operational amplifier 264 is less than the voltage at the non-inverting input of the operational amplifier 264, the voltage error output signal 222 will increase until the voltages at the inverting and non-inverting inputs are balanced, then maintain that level. When the voltage at the inverting input of the amplifier 264 is greater than the voltage at the non-inverting input of the amplifier 264, the voltage error output signal 222 will be decreased until the voltages at the inverting and non-inverting inputs are balanced, then maintain that level.

As explained above, the voltage error output signal 222 is coupled to the pulse width modulator controller 208 (FIG. 4). The control signal 216 is generated based on the voltage error output signal 222 and determines the modulated power output 218 produced by the pulse width modulator 210.

One embodiment of the power control circuit 203 includes voltage and current control modes. The power control circuit 203 enters the voltage control mode when the measured load current 226 is less than the target load current 228, and the power control circuit 203 enters the current control mode when the measured load current 226 exceeds the target load current 228. In other words, when the load current to the testing stage 112 is within the operational limits of the one or more power stages 202 (e.g., the power supplies 214) being controlled by the power control circuit 203, the voltage error output signal 222 will be substantially based on the difference between the measured load voltage 234 at the first input 258 of the voltage control circuit 206 and the target load voltage 236 at the second input 260 of the voltage control circuit 206. However, when the measured load current 226 exceeds the target load current 228, the power control circuit 203 enters the current control mode and the voltage error output signal 222 is substantially based on the current error output signal 224.

In one embodiment, the current error output signal 224 is coupled to the second input 260 of the voltage control circuit 206 through a diode (e.g., Schottkey diode) 280, as shown in FIG. 5. The cathode of the diode 280 is coupled to the current error output signal 224 and the anode of the diode 280 is coupled to the non-inverting input of the operational amplifier 264 of the voltage control circuit.

When the power control circuit 203 is in the voltage control mode of operation (i.e., measured load current 226 is less than the target load current 228), the current error output signal 224 is at the "high" voltage level. The current control circuit 204 is designed such that this "high" voltage level causes the diode 280 to be reversed biased. As a result, the voltage at the non-inverting input of the operational amplifier 264 of the voltage control circuit 206 substantially corresponds to the target load voltage 236.

Thus, when the power control circuit 203 is in the voltage control mode, the voltage error output signal 222 will be substantially based on the difference between the measured load voltage 234 at the first input 258 and the target load voltage 236 at the second input 260. Additionally, when the power control circuit 203 is in the voltage control mode, the voltage error output signal 222 is substantially unaffected by changes in the current error output signal 224 that is at the "high" voltage level.

When the power control circuit 203 enters the current control mode of operation (i.e., the measured load current 226 exceeds the target load current 228), the current error output signal 224 is at the "low" voltage level. The current control circuit 204 is designed such that this "low" voltage level causes the diode 280 to be forward biased. As a result, the voltage at the non-inverting input of the operational amplifier 264 of the voltage control circuit 206 is lowered or pulled below the level set by the target load voltage 236 at the second input 260. Therefore, the voltage error output signal 222 will be based on a difference between the measured load voltage 234 and a voltage that is less than the target load voltage 236 when the power control circuit 203 is in the current control mode.

Thus, in accordance with one embodiment, when the power control circuit 203 is in the current control mode, the voltage error output signal 222 will be based on the current error output signal 224 and the measured load voltage 234. Accordingly, the voltage error output signal 222 will be affected by changes in the current error output signal 224.

Method of Operating the Power Stage

Figure 6:
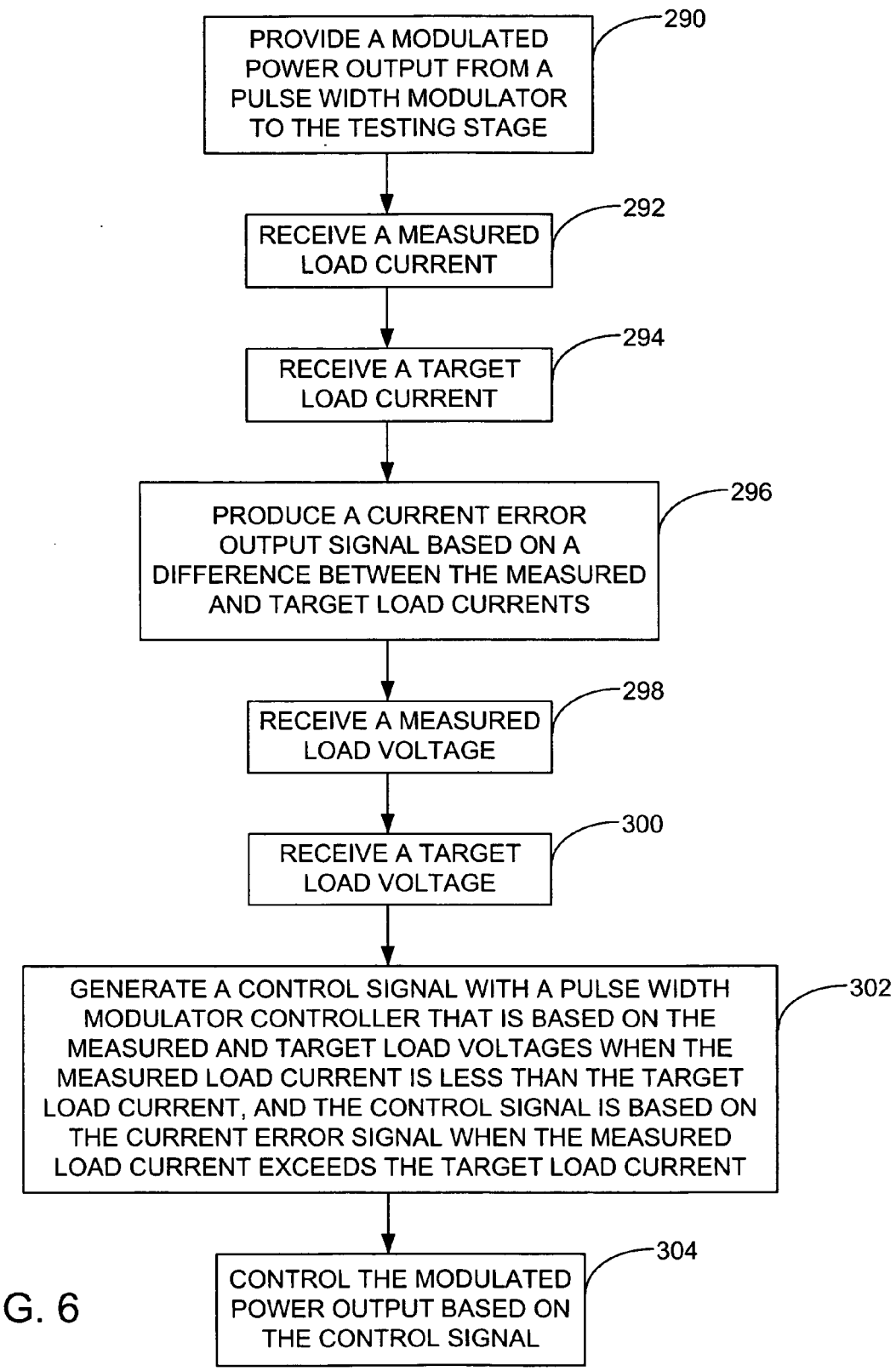
FIG. 6 is a flowchart illustrating a method of controlling power supplied to a testing stage of a burn-in system in accordance with embodiments of the invention.

FIG. 6 illustrates a method of operating the power stage 202 described above to control power supplied to the testing stage 112 of the burn-in system 200, in accordance with embodiments of the invention. At step 290, a modulated power output 218 is provided to a testing load 126 of the testing stage 112 from a pulse width modulator 210. A measured load current 226, which is indicative of a current supplied to the testing stage 112 by the modulated power output 218, is received at step 292, and a target load current 226 is received at step 294. Next, at step 296, a current error output signal 224 is produced based on a difference between the measured load current 226 and the target load current 228. A measured load voltage 234, which is indicative of a voltage across the load 126, and a target load voltage 236 are received at steps 298 and 300. At step 302, a control signal 216 is generated with a pulse width modulator controller 208 that is based on the measured load voltage 234 and the target load voltage 236 when the measured load current 226 is less than the target load current 228, and the control signal 216 is based on the current error output signal 224 when the measured load current 226 exceeds the target load current 228. Finally, at step 304, the modulated power output 218 is controlled based on the control signal 216.

In one embodiment of the method, the measured load voltage 234 is received at a first input 258 of a voltage control circuit 206 and the target load voltage 236 is received at a second input 260 of the voltage control circuit 206. Additionally, the current error output signal 224 is coupled to the first or second input of the voltage control circuit 206 and the voltage error output signal 222 is produced based on a voltage difference between the first and second inputs of the voltage control circuit 206. The control signal 216 is generated using the pulse width modulator controller 208 based on the voltage error output signal 222.

In accordance with another embodiment of the method, the current error output signal 224 is coupled to the second input 258 of the voltage control circuit 206. The voltage error output signal 222 is then produced by the voltage control circuit 206 such that it fluctuates based on changes in the voltage difference between the measured load voltage 234 and the target load voltage 236 when the measured load current 226 is less than the target load current 228, and the voltage error output signal 222 fluctuates based on changes in the current error output signal 224 when the measured load current 226 is greater than the target load current 228. In one embodiment, the voltage of the second input 260 of the voltage control circuit 206 is lowered below the target load voltage 236 using the current error output signal 224 when the measured load current 226 is greater than the target load current 228.

Thus, embodiments of the power control circuit 203 described above operate to control the modulated power output 218 produced by the pulse width modulators 210 of the power stage(s) 202 based on the measured and target load voltages 234 and 236 to maintain a desired voltage across the testing load 126 when the power control circuit 203 is in the voltage control mode. Also, the control of the modulated power output 218 is substantially unaffected by the current error output signal 224 produced by the current control circuit 204 when the power control circuit 203 is in the voltage control mode. In the event that the current supplied to the testing stage 112 (measured load current 226) exceeds the set limit (target load current 228), the power control circuit 203 switches to the current control mode and the modulated power output 218 will decrease the power supplied to the testing stage 112 to reduce the current delivered to the testing stage 112 to a level that is generally equal to that indicated by the target load current 228. The decrease in the modulated power output 218 occurs in response to the affect the current error output signal 224 has on the voltage error output signal 222. The power control circuit 203 will switch from the current control mode back to the voltage control mode when the measured load current 226 drops below the target load current 228.

Figure 1:
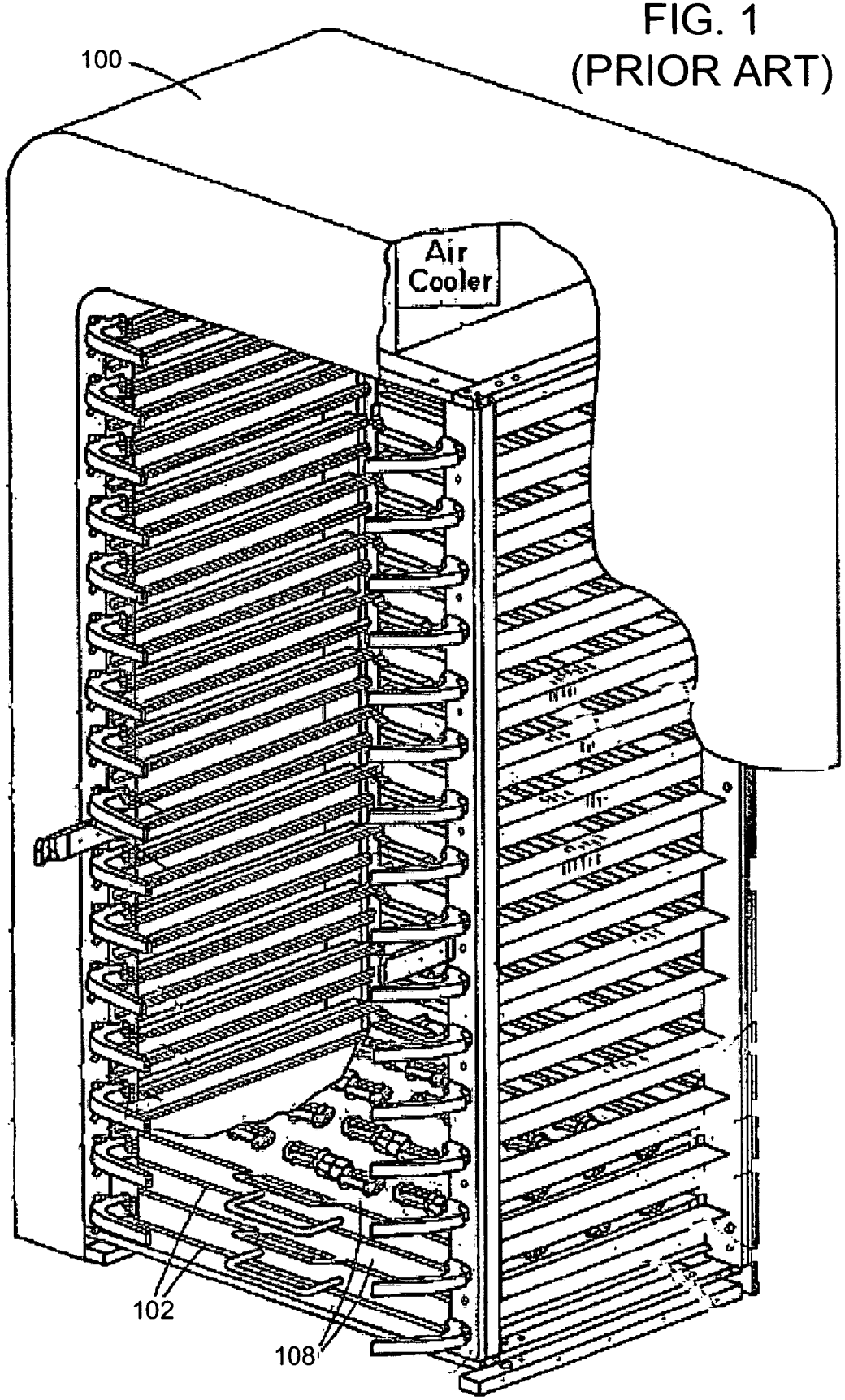
FIG. 1 is a perspective view of an exemplary burn-in oven with a portion of the housing removed to show a plurality of burn-in boards, in accordance with the prior art.
Figure 2:
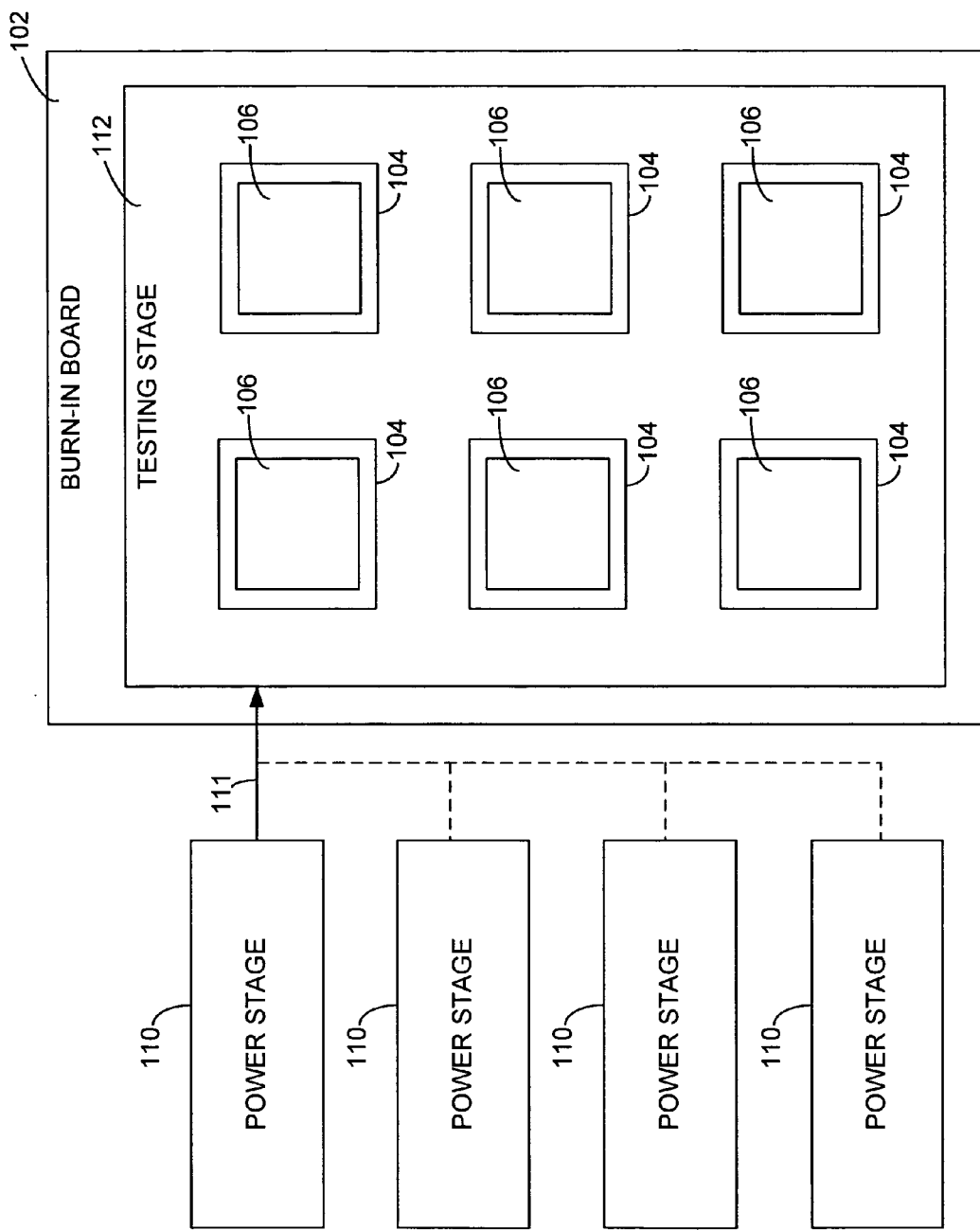
FIGS. 2 and 3 are schematic diagrams of a burn-in system in accordance with the prior art.

The switching of the power control circuit 203 between the voltage and current control modes allows for continuous, high power testing of the integrated circuit chips or electronic devices 106 (FIG. 2) of the testing stage 112 while protecting the power supply 214 and other components of each of the power stages 202 that are in use from excessive currents.

Additionally, the transitions between the voltage and current control modes are performed much more seamlessly than burn-in systems of the prior art. That is, the voltage control circuit 206 is less likely to produce errant voltage error output signals 222 during transitions between the voltage and current control modes. For example, the voltage control circuit 206 is less likely to produce a voltage error output signal 222 that rapidly fluctuates between the voltage rails ($+/-V_{cc}$) of the operational amplifier 264 during power control circuit 203 mode transitions.

As a result, the modulated power output 218 produced by the embodiments of the power stage(s) 202 described above can be more accurately controlled and is less likely to include transients and other undesired characteristics during transitions between the voltage and current control modes, unlike burn-in systems of the prior art. This results in more accurate testing of the integrated circuits. Additionally, the modulated power output 218 produced by the power stage(s) 202 of the present invention is less likely to include undesired transient signals that could damage the integrated circuits being tested.

Another embodiment of the invention is directed to a burn-in system 200 having multiple power modes. One embodiment of the burn-in system 200 includes one or more single power modes and a dual power mode. When in the single power mode, a single power stage and its power supply operate to supply power to the testing stage based on an error signal produced by a single mode power control circuit. When in the dual power mode, the power outputs from two power stages are coupled together and supply power to the testing stage based on an error signal from a dual mode power control circuit. In another embodiment, the error signals from the single mode power control circuit and the dual mode power control circuit are selectively routed to the pulse width modulator controller(s) based on the particular power mode of operation. These and other embodiments of the invention will be discussed below in greater detail.

Multiple Power Modes

Figure 7:
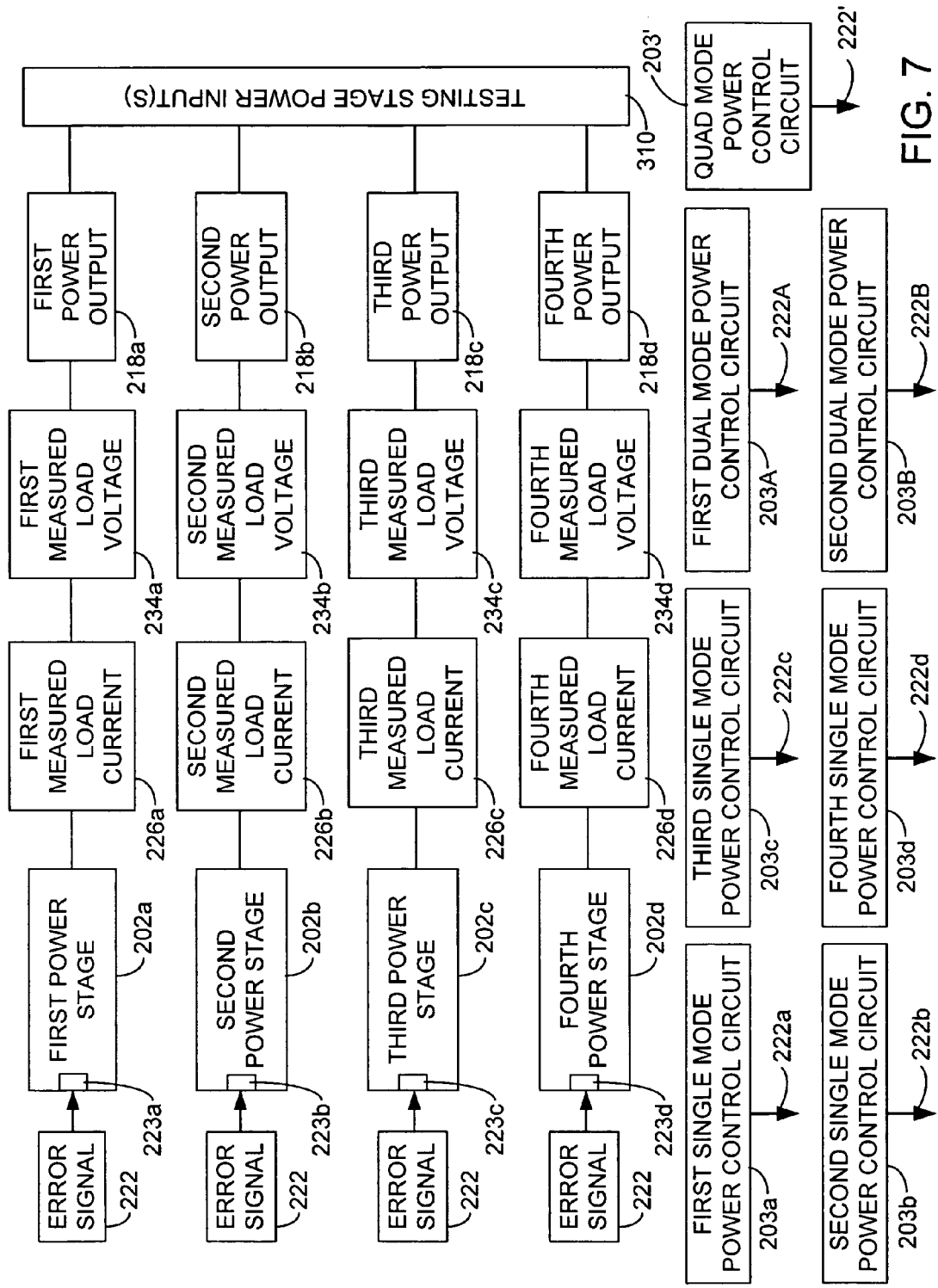
FIG. 7 is a block diagram of a burn-in system in accordance with embodiments of the invention.

FIG. 7 is a block diagram of an exemplary burn-in system 200, in accordance with embodiments of the invention. Elements that are the same or similar to those described above are labeled in a similar manner. The burn-in system 200 generally includes two or more power stages, generally referred to as 202, and two or more power control circuits, generally referred to as 203, that allow the burn-in system to have multiple power modes of operation. Although the burn-in system 200 is illustrated as having four power stages 202 and seven power control circuits 203, it is understood that embodiments of the present invention include burn-in systems having at least two power stages 202 and at least two power control circuits 203.

In one embodiment, the burn-in system 200 includes two or more power stages 202, such as a first power stage 202a, a second power stage 202b, a third power stage 202c and a fourth power stage 202d, which are in accordance with the embodiments described above with reference to FIG. 4.

Thus, each of the power stages 202a-d includes a power supply 214, a pulse width modulator 210 and a pulse width modulator controller 208. The pulse width modulator controller 208 of each of the power stages 202a-d produces a control signal 216 based on an error signal 222 received at the corresponding error input 223a-d. The control signals 216 respectively control the power outputs 218a-d generated by the pulse width modulators 210 of the power stages 202a-d.

Embodiments of the burn-in system 200 also include two or more power control circuits 203 for handling different power modes of the burn-in system 200. The power control circuits 203 operate in accordance with the embodiments described above with reference to FIGS. 4 and 5. Thus, the power control circuits 203 each produce an error signal, generally referred to as 222, that is selectively fed to the error input 223 of one or more of the pulse width modulator controllers 208 of the power stages 202. Each of the error signals 222 are produced based on a measured load current, generally referred to as 226 and/or a measured load voltage, generally referred to as 234, as described above. In one embodiment, a target load current 228 and a target load voltage 236 (FIG. 4) also play a role in the production of the error signals 222.

The error signals 222 can be coupled to the error input 223 of one or more of the pulse width modulator controllers 208, which control the power outputs 218 generated by the corresponding pulse width modulators. The power outputs 218 can be supplied to the testing stage 112 through one or more testing stage power inputs, generally referred to as 310. In some power modes, one or more of the power outputs 218 can be coupled to a testing stage power input 310 to effectively couple the power outputs together.

In one embodiment, the measured load currents 226 and the measured load voltages 234 utilized by the power control circuits 203 correspond to the power outputs 218 produced by the power stages 202, as illustrated in FIG. 7, and can be obtained in the manner described above, or another suitable method. Thus the first measured load current 226a is indicative of the current supplied by the first power output 218a, the second measured load current 226b is indicative of the current supplied by second power output 218b, the third measured load current 226c is indicative of the current supplied by the third power output 218c and the fourth measured load current 226d is indicative of the current supplied by the fourth power output 218d. Similarly, the first measured load voltage 234a is indicative of the voltage supplied by the first power output 218a, the second measured load voltage 234b is indicative of the voltage supplied by the second power output 218b, the third measured load voltage 234c is indicative of the voltage supplied by the third power output 218c and the fourth measured load voltage 234d is indicative of the voltage supplied by the fourth power output 218d.

The current control circuits 204 of the power control circuits 203 shown in FIG. 7 are, for example, each configured to generate a current error signal 224 based on one or more of the measured load currents 226a-d and their corresponding target load current 228 (FIG. 4). The voltage control circuits 206 of the power control circuits 203 are, for example, each configured to generate a voltage error signal 222 (e.g., voltage error signals 222a-d, 222A-B and 222') based on one or more of the measured load voltages 234a-d and the corresponding current error signal 224, or one or more of the measured load voltages 234a-d and their corresponding target load voltage 236, depending on whether the power control circuits 203 are operating in their current or voltage control mode. The voltage error signals 222 are generated based on the corresponding current error signals 224 and the corresponding measured load voltages 234, when the power control circuits 203 are in their current control modes, as discussed above.

Single Power Mode

Figure 8:
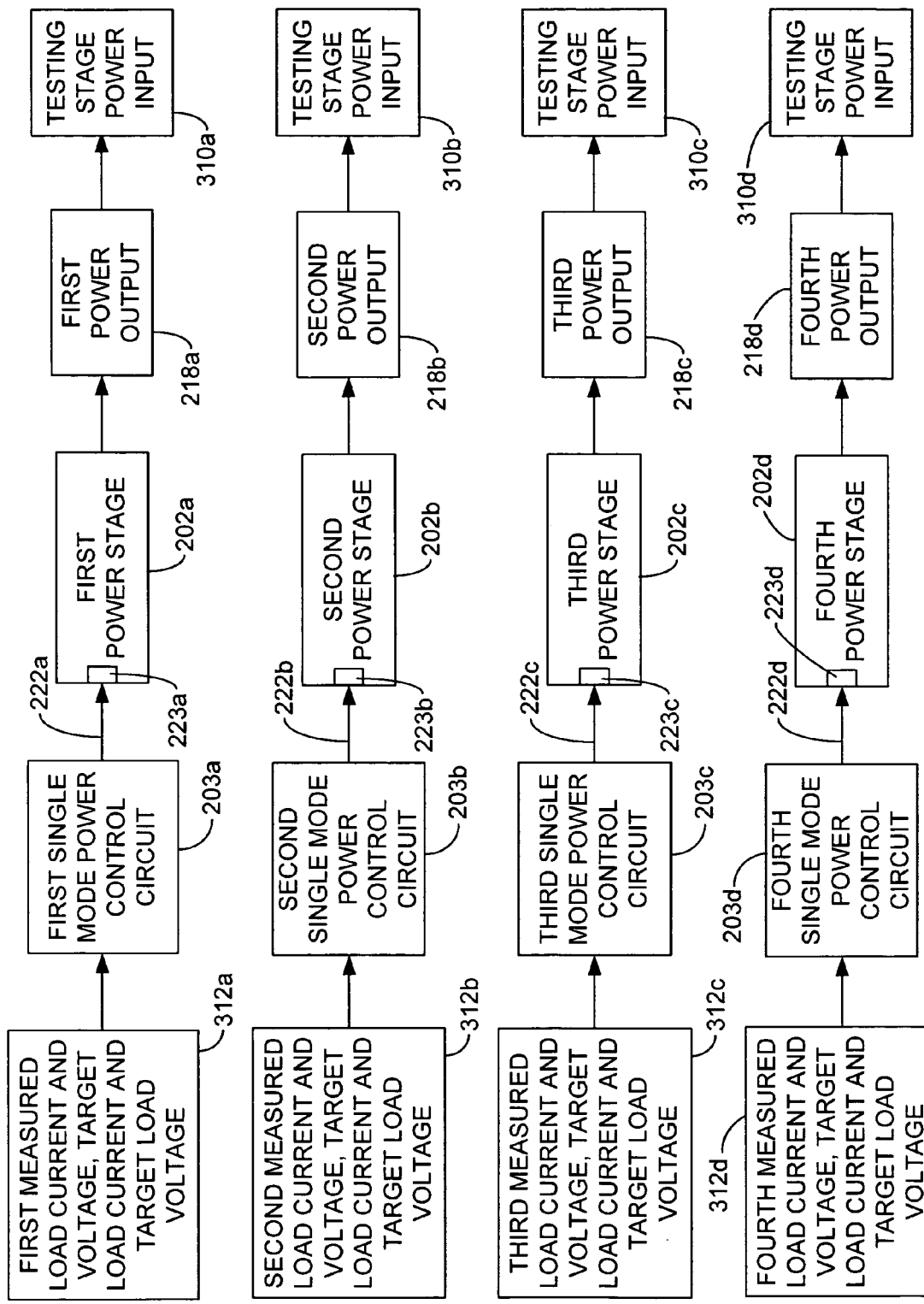
FIG. 8 is a block diagram of the burn-in system of FIG. 7 operating in single power modes, in accordance with embodiments of the invention.

One embodiment of the burn-in system 200 includes a single power mode of operation, embodiments of which are illustrated in the block diagram of FIG. 8. When in the single power mode, one or more of the power stages 202a-d provide power, independently of the other power stages 202, to a corresponding testing stage power input 310a-d that supplies the power to the testing stage 112 for stress testing one or more integrated circuit chips or electronic devices represented by the testing load 126 (FIG. 4). This mode of operation provides a relatively low level of power to the testing stage power inputs 310 as compared to the power modes described below that combine the power outputs 218 of multiple power stages 202.

In accordance with one embodiment, the burn-in system 200 includes at least one single mode power control circuit 203, such as a first single mode power control circuit 203a, a second single mode power control circuit 203b, a third single mode power control circuit 203c and/or a fourth single mode power control circuit 203d. The single mode power control circuits 203a-d are configured (i.e., tuned) to respectively control the power stages 202a-d to provide the power outputs 218a-d to the testing stage power inputs 310a-d of the testing stage 112, as shown in FIG. 8. Each of the single mode power control circuits 203a-d respectively receives one of the measured load currents 226a-d and one of the measured load voltages 234a-d of the power outputs 218a-d that correspond to the power stage 202a-d being controlled, as indicated by boxes 312a-d. In this embodiment, each of the measured load voltages 234a-d indicate a voltage across a testing load 126 that is coupled to the corresponding testing stage power input 310a-d. Additionally, the single mode power control circuits 203a-d can receive target load currents 228 and target load voltages 236, as indicated by boxes 312a-d.

Thus, the first single mode power control circuit 203a uses these measured and target inputs to generate a first single mode voltage error signal 222a that is delivered to the first power stage 202a, which produces the first power output 218a in response thereto, as explained above. The second single mode power control circuit 203b uses these measured and target inputs to generate a second single mode voltage error signal 222b that is delivered to the second power stage 202b, which produces the second power output 218b accordingly. The third single mode power control circuit 203c uses these measured and target inputs to generate a third single mode voltage error signal 222c that is delivered to the third power stage 202c, which produces the third power output 218c accordingly. The fourth single mode power control circuit 203d uses these measured and target inputs to generate a fourth single mode voltage error signal 222d that is delivered to the fourth power stage 202d, which produces the fourth power output 218d accordingly.

Dual Power Mode

Figure 9:
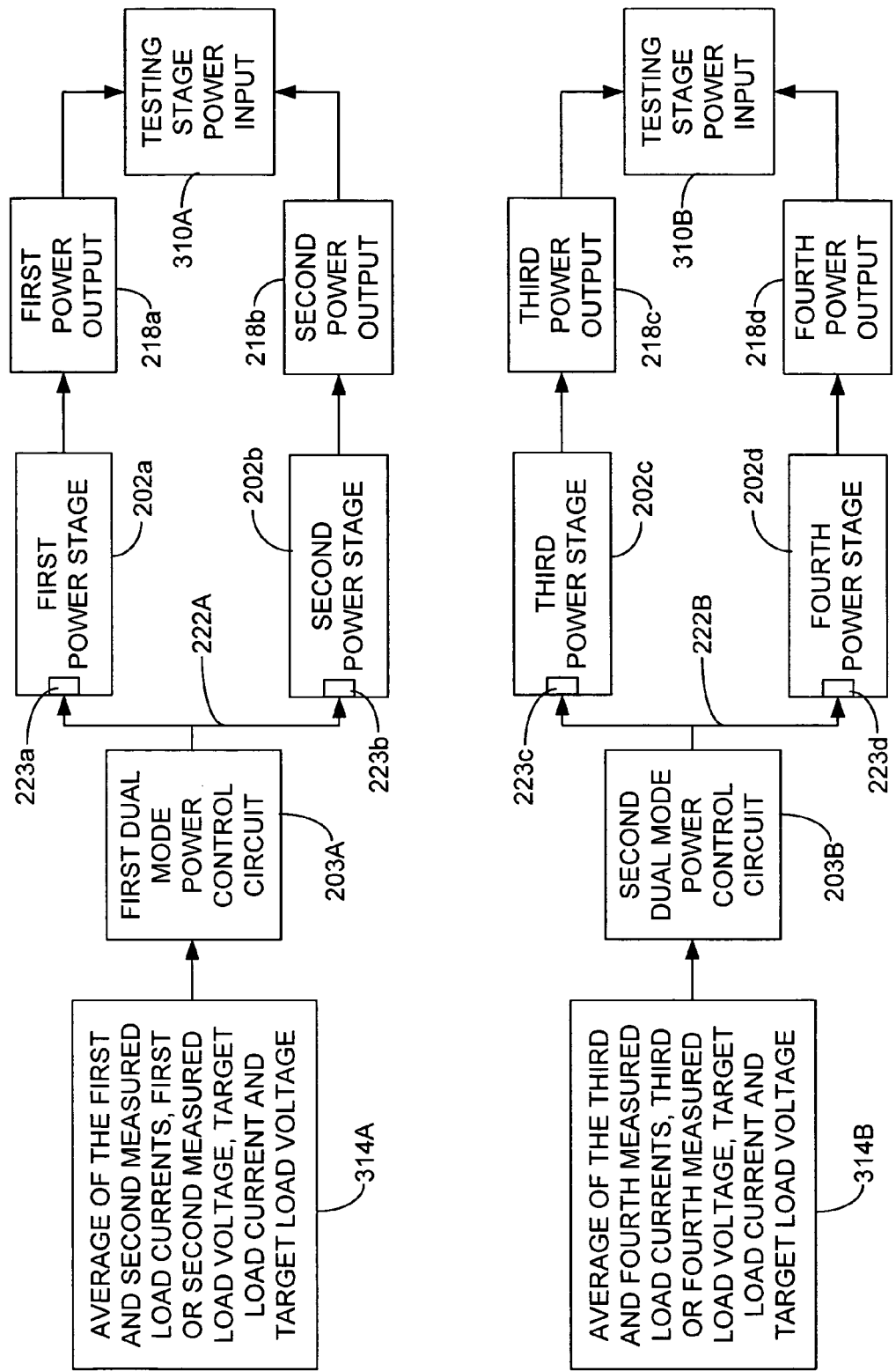
FIG. 9 is a block diagram of the burn-in system of FIG. 7 operating in dual power modes, in accordance with embodiments of the invention.

In accordance with another embodiment, the burn-in system 200 includes at least one dual power mode of operation, embodiments of which are illustrated in the block diagram of FIG. 9. When in the dual power mode, the power outputs 218 from pairs of the power stages 202a-d are coupled together to provide power to a power input 310 that supplies the power to the testing stage 112 for stress testing one or more integrated circuit chips or electronic devices represented by the testing load 126 (FIG. 4). This dual power mode of operation provides approximately two times the level of power (i.e., current) to the testing stage 112 than can be provided in the single power mode. For example, when the burn-in system 200 is in the single power mode the power stages 202 may be configured to deliver a maximum of 100 amperes to the testing stage 112, but when the burn-in system 200 is in the dual power mode, the coupling of the power outputs 218 of two of the power stages 202 allows for 200 amperes of current to be supplied to the testing stage 112.

In accordance with one embodiment, the burn-in system 200 includes at least one dual mode power control circuit 203, such as a first dual mode power control circuit 203A and/or a second dual mode power control circuit 203B. Each of the dual mode power control circuits 203A-B are configured (i.e., tuned) to control one pair of the power stages, such as power stage pair 202a and 202b, and power stage pair 202c and 202d, respectively. The power outputs 218a and 218b from power stage pair 202a and 202b are coupled together and provided to the testing stage power input 310A of the testing stage 112, as shown in FIG. 9. Likewise, the power outputs 218c and 218d from power stage pair 202c and 202d are coupled together and provided to the testing stage power input 310B of the testing stage 112, as shown in FIG. 9.

In one embodiment, the current control circuits 204 of the dual mode power control circuits 203A-B respectively produce first and second dual mode current error signals 224 based on one or both of the measured load currents 226 corresponding to the power outputs 218 from their pair of power stages 202. In one embodiment, the dual mode power control circuits 203A-B respectively produce first and second dual mode current error signals 224 based on an average of the pair of measured load currents corresponding to the power outputs 218 from their pair of power stages 202, as indicated in boxes 314A and 314B in FIG. 9. Thus, in one embodiment, the power control circuit 203A receives or calculates an average of the measured load currents 226a and 226b and the power control circuit 203B receives or calculates an average of the measured load currents 226c and 226d. The averages of the measured load current pair 226a and 226b and the measured load current pair 226c and 226d are obtained using conventional methods.

Each of the first and second dual mode power control circuits 203A and 203B also receive a measured load voltage corresponding to the voltage across the testing load 126 (FIG. 4) that is coupled to the corresponding testing stage power inputs 310A and 310B. Because the power output pair 218a and 218b are coupled together, one embodiment of the measured load voltage for the first dual mode power control circuit 203A is obtained from either the first measured load voltage 234a or the second measured load voltage 234b, as indicated in box 314A. Likewise, because the power output pair 218c and 218d are coupled together, one embodiment of the measured load voltage for the second dual mode power control circuit 203B is obtained from either the third measured load voltage 234c or the fourth measured load voltage 234d, as indicated in box 314B. In one embodiment, the dual mode power control circuits 203A and 203B receive target load currents 228 and target load voltages 236, as indicated by boxes 314A and 314B.

The first dual mode power control circuit 203A uses the measured and target load current and voltage values to generate a first dual mode voltage error signal 222A that is delivered to the error inputs 223a and 223b of the first and second power stages 202a and 202b, which produce the first and second power outputs 218a and 218b accordingly, as shown in FIG. 9. The second dual mode power control circuit 203B uses the measured and target load current and voltage values to generate a second dual mode voltage error signal 222B that is delivered to the error inputs 223c and 223d of the third and fourth power stages 202c and 202d, which produce the third and fourth power outputs 218c and 218d accordingly.

Quad Power Mode

Figure 10:
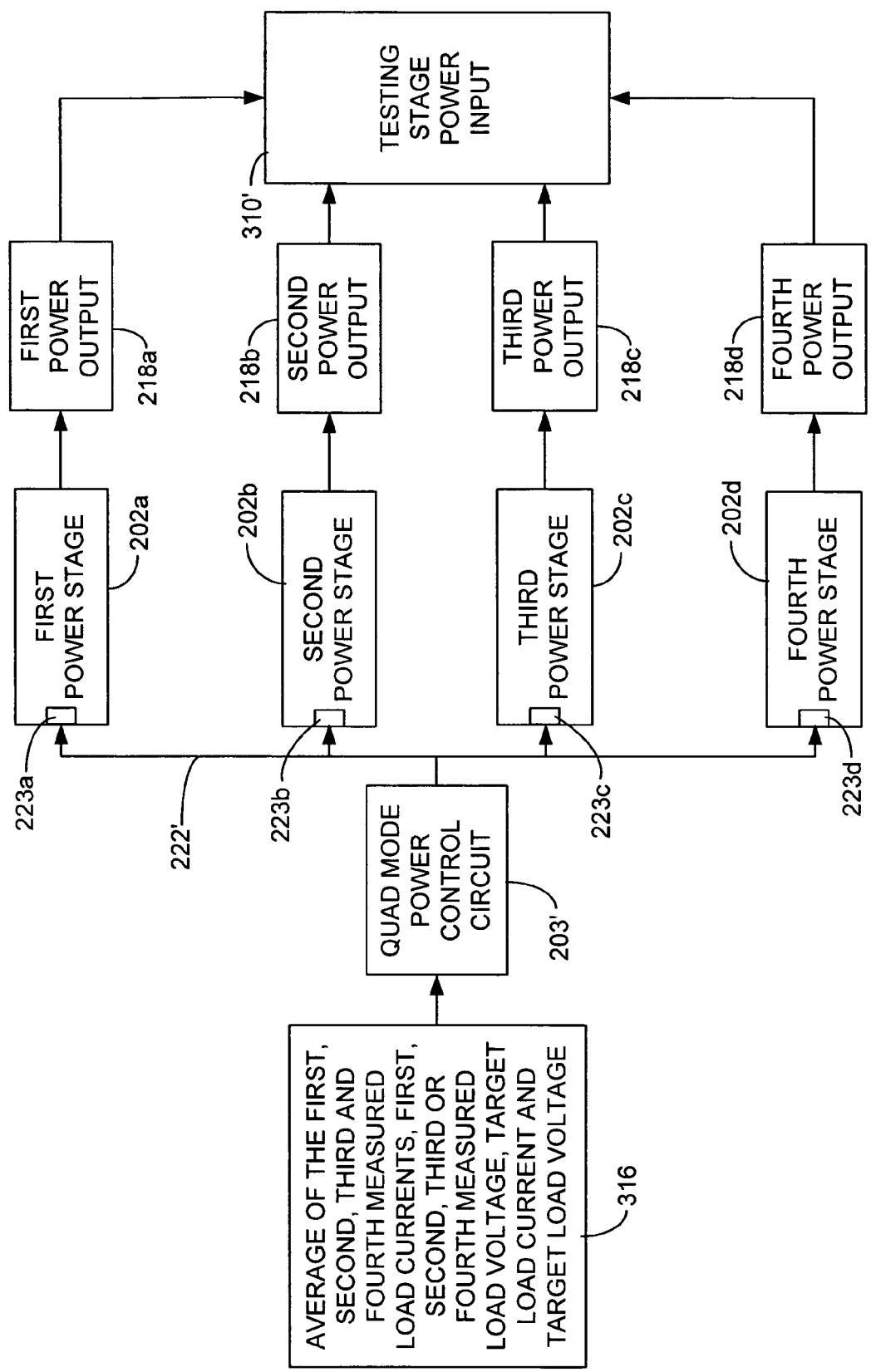
FIG. 10 is a block diagram of the burn-in system of FIG. 7 operating in a quad power mode, in accordance with embodiments of the invention.

In accordance with another embodiment, the burn-in system 200 includes at least one quad power mode of operation, embodiments of which are illustrated in the block diagram of FIG. 10. When in the quad power mode, the power outputs 218a-d from four power stages 202a-d are coupled together to provide power to a power input 310' that supplies the power to the testing stage 112 for stress testing one or more integrated circuit chips or electronic devices represented by the testing load 126 (FIG. 4). This quad power mode of operation provides approximately four times power (i.e., more current) to the testing stage 112 than can be provided by a single instance of the single power mode. For example, when the burn-in system 200 is in the single power mode each of the individual power stages 202a-d may deliver a maximum of 100 amperes to the testing stage 112, but when the burn-in system 200 is in the quad power mode, the coupling of the power outputs 218a-d of the four of the power stages 202a-d allows for 400 amperes of current to be supplied to the testing stage 112.

In accordance with one embodiment, the burn-in system 200 includes at least one quad mode power control circuit 203'. The quad mode power control circuit 203' is configured (i.e., tuned) to control the four power stages 202a-d, based on a quad mode voltage error signal 222'. The power outputs 218a-d from the power stages 202a-d are coupled together and provided to the testing stage power input 310' of the testing stage 112, as shown in FIG. 10.

In one embodiment, the current control circuit 204 of the quad mode power control circuit 203' produces the current error signal 224 based on one of the measured load currents 226a-d (FIG. 7). In another embodiment, the current control circuit 204 of the quad mode power control circuit 203' produces the current error signal 224 based on an average of the measured load currents 226a-d corresponding to the power outputs 218a-d from the power stages 202a-d, as indicated by box 316 in FIG. 10. The average of the measured load currents 226a-d can be obtained in accordance with conventional methods.

The voltage control circuit 206 of quad mode power control circuit 203' receives a measured load voltage 234 corresponding to the voltage across the testing load 126 (FIG. 4) of the testing stage 112 coupled to the testing stage power input 310'. Because the power outputs 218a-d are coupled together, one embodiment of the measured load voltage for the quad mode power control circuit 203' is obtained from any one of the measured load voltages 234a-d, as indicated by box 316. In one embodiment, the quad mode power control circuit 203' receives a target load current 228 and target load voltage 236, as indicated by box 316 in FIG. 10.

The quad mode power control circuit 203' uses the measured and target load current and voltage values to generate a quad mode voltage error signal 222' that is delivered to the error inputs 223a-d of the power stages 202a-d, as shown in FIG. 10. The power stages 202a-d produce the power outputs 218a-d in response to the quad mode voltage error signal 222'. The power outputs 218a-d are coupled together and provided to the testing stage power output 310' to supply the power to the testing stage 112.

Simplified Power Mode Setup

Figure 11:
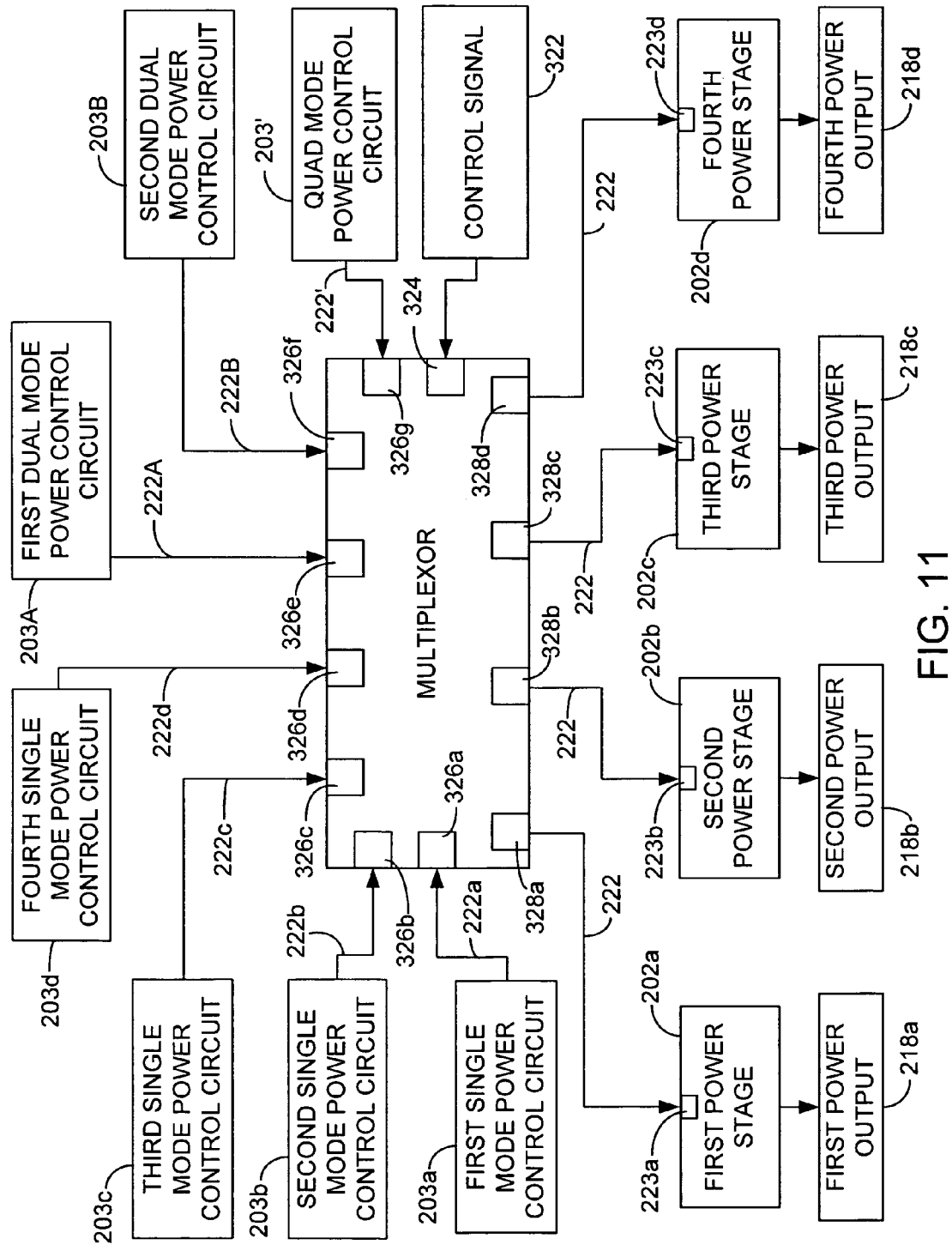
FIG. 11 is a block diagram of the burn-in system in accordance with embodiments of the invention.

Another embodiment of the invention simplifies the selection of the power mode of the burn-in system 200. In one embodiment, the burn-in system 200 includes a multiplexor 320, shown in FIG. 11, that operates to selectively deliver the error signals 222 from the power control circuits 203 to the desired error inputs 223 of the power stages 202 based on a control signal 322 received at a control signal input 324 of the multiplexor 320. This arrangement simplifies the setup of the burn-in system 200 in the desired power mode of operation.

Embodiments of the multiplexor 320 include multiple inputs, generally referred to as 326, that are each coupled to one of the error signals produced by the power control circuits 203. Embodiments of the multiplexor 320 also include multiple outputs, generally referred to as 328, that are each coupled to one of the error inputs 223 of the power stages 202. The multiplexor 320 connects one of the inputs 326 to the desired outputs 328 in response to the control signal 322, in accordance with conventional multiplexor operations. It is understood by those skilled in the art that the function of the multiplexor 320 can be implemented using multiple multiplexors while still remaining within the spirit and scope of the present invention.

Embodiments of the multiplexor 320 include a first multiplexor input 326a coupled to the first single mode voltage error signal 222a, a second multiplexor input 326b coupled to the second single mode voltage error signal 222b, a third multiplexor input 326c coupled to the third single mode voltage error signal 222c, a fourth multiplexor input 326d coupled to the fourth single mode voltage error signal 222d, a fifth multiplexor input 326e coupled to the first dual mode voltage error signal 222A, a sixth multiplexor input 326f coupled to the second dual mode voltage error signal 222B and a seventh multiplexor input 326g coupled to the quad mode voltage error signal 222'. The multiplexor 320 can have more or fewer inputs 326 depending on the number of error signals 222 being used by the system 200.

Additionally, embodiments of the multiplexor 320 include a first multiplexor output 328a coupled to the first error input 223a, a second multiplexor output 328b coupled to the second error input 223b, a third multiplexor output 328c coupled to the third error input 223c and a fourth multiplexor output 328d coupled to the fourth error input 223d. The multiplexor 320 can have more or fewer outputs 328 depending on the number of power stages 202 used by the burn-in system 200.

The multiplexor connects the inputs 326 to the appropriate outputs 328 in response to the multiplexor control signal 322 depending on the power mode of the burn-in system 200. For instance, the burn-in system 200 can be set up for one or more of the single power modes described above with reference to FIG. 8 by directing the multiplexor 320 to connect the first input 326a to the first output 328a, the second input 326b to the second output 328b, the third input 326c to the third output 328c and the fourth input 326d to the fourth output 328d, based on the control signal 322. The burn-in system 200 can also be configured in one or more of the dual power modes described above with reference to FIG. 9 by directing the multiplexor 320 to connect the fifth input 326e to the first and second outputs 328a and 328b and the sixth input 326f to the third and fourth outputs 328c and 328d, based on the control signal 322. Additionally, the burn-in system 200 can be configured in one or more quad power modes described above with reference to FIG. 10 by directing the multiplexor 320 to connect the seventh input 326g to the first, second, third and fourth outputs 328a-d, based on the control signal 322.

Method of Supplying Power to the Testing Stage

Another embodiment of the invention is directed to a method of supplying power to the testing stage 112, based on the embodiments of the invention described above. In the method, operation of the burn-in system 200 in either a single power mode or a dual power mode is selected. In one embodiment, this selection is performed by providing an appropriate control signal 322 to the input 324 of the multiplexor 320.

When the single power mode is selected, a first power output 218 is produced by the first power stage 202a and is coupled to the testing stage 112, such as at the testing stage power input 310a. A first single mode current error signal 224 (FIGS. 4 and 5) is generated based on the first measured load current 226a, as described above. In one embodiment, the first single mode current error signal 224 is generated using the first single mode power control circuit 203a described above. The first single mode current error signal 224 is coupled to an input (e.g., input 260 shown in FIG. 5) of a first single mode voltage control circuit 206 (FIGS. 4 and 5) of the power control circuit 203a. A first single mode voltage error signal 222a is generated using the first single mode voltage control circuit 206. The first power output 218a is controlled based on the first single mode voltage error signal 222a.

Additional embodiments of the single power mode selection include respectively coupling the second, third and/or fourth power outputs 218b-d to testing stage power inputs 310b-d and controlling the power outputs 218b-d based on the single mode voltage error signals 222b-c, as described above. For example, when the single power mode is selected, the second power output 218b is produced by the second power stage 202b and is coupled to the testing stage 112, such as at the testing stage power input 310b. A second single mode current error signal 224 (FIGS. 4 and 5) is generated based on the second measured load current 226b, as described above. In one embodiment, the second single mode current error signal 224 is generated using the second single mode power control circuit 203b described above. The second single mode current error signal 224 is coupled to an input (e.g., input 260 shown in FIG. 5) of a second single mode voltage control circuit 206 (FIGS. 4 and 5) of the power control circuit 203b. A second single mode voltage error signal 222b is generated using the second single mode voltage control circuit 206. The second power output 218b is controlled based on the second single mode voltage error signal 222b.

When the dual power mode is selected, the first and second power outputs 218a and 218b, produced by power stages 202a and 202b, are coupled together and to the testing stage 112, such as at the testing stage power input 310A. A dual mode current error signal 224 (FIGS. 4 and 5) is generated based on the first measured load current 226a and/or the second measured load current 226b, as described above. In one embodiment, the dual mode current error signal 224 is generated using the dual mode power control circuit 203A described above. The dual mode current error signal is coupled to an input (e.g., input 260 shown in FIG. 5) of a dual mode voltage control circuit 206 (FIGS. 4 and 5) of the dual mode power control circuit 203A, which generates a dual mode voltage error signal 222A. The first and second power outputs 218a and 218b are controlled using the dual mode voltage error signal 222A.

Additional embodiments of the method of the present invention include selecting a quad mode of operation where the power provided to the testing stage 112 is controlled in the manner described above.

Although the present invention has been described with reference to preferred embodiments, workers skilled in the art will recognize that changes may be made in form and detail without departing from the spirit and scope of the invention. For example, embodiments of the burn-in system described above also include the use of three power stages 202 in a triple power mode based on the principles described above.

What is claimed is:

1. A burn-in system for testing integrated circuits comprising:
   a testing stage configured to stress test an integrated circuit;
   a first power stage comprising:
      a first pulse width modulator controller having a first error input, the first pulse width modulator controller configured to produce a first control signal in response to a signal received at the first error input; and
      a first pulse width modulator configured to produce a first power output in response to the first control signal;
   a second power stage comprising:
      a second pulse width modulator controller having a second error input, wherein the second pulse width modulator controller is configured to produce a second control signal in response to a signal received at the second error input; and
      a second pulse width modulator configured to produce a second power output in response to the second control signal;
   a first single mode power control circuit comprising:
      a current control circuit configured to generate a first single mode current error signal based on a first measured load current, which is indicative of the current supplied by the first power output; and
      a voltage control circuit coupled to the first single mode current error signal and configured to generate a first single mode voltage error signal;
   a first dual mode power control circuit comprising:
      a current control circuit configured to generate a first dual mode current error signal based on at least one of the first measured load current and a second measured load current, which is indicative of the current supplied by the second power output; and
      a voltage control circuit coupled to the first dual mode current error signal and configured to generate a first dual mode voltage error signal;
   wherein:
      the burn-in system comprises a single power mode, in which the first single mode voltage error signal is coupled to the first error input and the first power output is coupled to the testing stage; and
      the burn-in system comprises a dual power mode, in which the first dual mode voltage error signal is coupled to the first and second error inputs, and the first and second power outputs are coupled to the testing stage.

2. The burn-in system of claim 1, further comprising a multiplexor comprising:

a first multiplexor input coupled to the first single mode voltage error signal;
a second multiplexor input coupled to the first dual mode voltage error signal;
a first multiplexor output coupled to the first error input; and
a second multiplexor output coupled to the second error input;
wherein:
the first multiplexor input is coupled to the first multiplexor output when the burn-in system is in the single power mode; and
the second multiplexor input is coupled to the first and second multiplexor outputs when the burn-in system is in the dual power mode.

3. The burn-in system of claim 1, further comprising a second single mode power control circuit comprising:
a current control circuit configured to generate a second single mode current error signal based on the second measured load current; and
a voltage control circuit coupled to the second single mode current error signal and configured to generate a second single mode voltage error signal;
wherein the second single mode voltage error signal is coupled to the second error input and the second power output is coupled to the testing stage when the burn-in system is in the single power mode.

4. The burn-in system of claim 3, further comprising a multiplexor comprising:
a first multiplexor input coupled to the first single mode voltage error signal;
a second multiplexor input coupled to the second single mode voltage error signal;
a third multiplexor input coupled to the first dual mode voltage error signal;
a first multiplexor output coupled to the first error input; and
a second multiplexor output coupled to the second error input;
wherein:
the first multiplexor input is coupled to the first multiplexor output and the second multiplexor input is coupled to the second multiplexor output when the burn-in system is in the single power mode; and
the third multiplexor input is coupled to the first and second multiplexor outputs when the burn-in system is in the dual power mode.

5. The burn-in system of claim 3, further comprising:
a third power stage comprising:
a third pulse width modulator controller having a third error input, the third pulse width modulator controller configured to produce a third control signal in response to a signal received at the third error input; and
a third pulse width modulator configured to produce a third power output in response to the third control signal;
a fourth power stage comprising:
a fourth pulse width modulator controller having a fourth error input, the fourth pulse width modulator controller configured to produce a fourth control signal in response to a signal received at the fourth error input; and
a fourth pulse width modulator configured to produce a fourth power output in response to the fourth control signal;

a third single mode power control circuit comprising:
a current control circuit configured to generate a third single mode current error signal based on a third measured load current, which is indicative of the current supplied by the third power output; and
a voltage control circuit coupled to the third single mode current error signal and configured to generate a third single mode voltage error signal;
a fourth single mode power control circuit comprising:
a current control circuit configured to generate a fourth single mode current error signal based on a fourth measured load current, which is indicative of the current supplied by the fourth power output; and
a voltage control circuit coupled to the fourth single mode current error signal and configured to generate a fourth single mode voltage error signal; and
a second dual mode power control circuit comprising:
a current control circuit configured to generate a second dual mode current error signal based on at least one of the third measured load current and the fourth measured load current; and
a voltage control circuit coupled to the second dual mode current error signal and configured to generate a second dual mode voltage error signal;
wherein:
the third single mode voltage error signal is coupled to the third error input, the third power output the third testing stage, the fourth single mode voltage error signal is coupled to the fourth error input and the fourth power output is coupled to the testing stage, when the burn-in system is in the single power mode; and
the second dual voltage error signal is coupled to the third and fourth error inputs, and the third and fourth power outputs are coupled to the testing stage, when the burn-in system is in the dual power mode.

6. The burn-in system of claim 5, further comprising a multiplexor comprising:
a first multiplexor input coupled to the first single mode voltage error signal;
a second multiplexor input coupled to the second single mode voltage error signal;
a third multiplexor input coupled to the third single mode voltage error signal;
a fourth multiplexor input coupled to the fourth single mode voltage error signal;
a fifth multiplexor input coupled to the first dual mode voltage error signal;
a sixth multiplexor input coupled to the second dual mode voltage error signal;
a first multiplexor output coupled to the first error input;
a second multiplexor output coupled to the second error input;
a third multiplexor output coupled to the third error input; and
wherein:
the first multiplexor input is coupled to the first multiplexor output, the second multiplexor input is coupled to the second multiplexor output, the third multiplexor input is coupled to the third multiplexor output and the fourth multiplexor input is coupled to the fourth multiplexor output, when the burn-in system is in the single power mode; and
the fifth multiplexor input is coupled to the first and second multiplexor outputs and the sixth multiplexor input is coupled to the third and fourth multiplexor outputs, when the burn-in system is in the dual power mode.

7. The burn-in system of claim 5, further comprising a quad mode power control circuit comprising:
   a current control circuit configured to generate a quad mode current error signal based on at least one of the first, second, third and fourth measured load currents; and
   a voltage control circuit coupled to the quad mode current error signal and configured to generate a quad mode voltage error signal;
   wherein the burn-in system comprises a quad power mode, in which the quad mode voltage error signal is coupled to the first, second, third and fourth error inputs and the first, second, third and fourth power outputs are coupled to the testing stage.

8. The burn-in system of claim 7, further comprising a multiplexor comprising:
   a first multiplexor input coupled to the first single mode voltage error signal;
   a second multiplexor input coupled to the second single mode voltage error signal;
   a third multiplexor input coupled to the third single mode voltage error signal;
   a fourth multiplexor input coupled to the fourth single mode voltage error signal;
   a fifth multiplexor input coupled to the first dual mode voltage error signal;
   a sixth multiplexor input coupled to the second dual mode voltage error signal;
   a seventh multiplexor input coupled to the quad mode voltage error signal;
   a first multiplexor output coupled to the first error input;
   a second multiplexor output coupled to the second error input;
   a third multiplexor output coupled to the third error input; and
   a fourth multiplexor output coupled to the fourth error input;
   wherein:
      the first multiplexor input is coupled to the first multiplexor output, the second multiplexor input is coupled to the second multiplexor output, the third multiplexor input is coupled to the third multiplexor output and the fourth multiplexor input is coupled to the fourth multiplexor output, when the burn-in system is in the single power mode;
      the fifth multiplexor input is coupled to the first and second multiplexor outputs and the sixth multiplexor input is coupled to the third and fourth multiplexor outputs, when the burn-in system is in the dual power mode; and
      the seventh multiplexor input is coupled to the first, second third and fourth multiplexor outputs, when the burn-in system is in the quad power mode.

9. A method of supplying power to a testing stage of a burn-in system comprising:
   selecting one of a single power mode and a dual power mode;
   when the single power mode is selected:
      producing a first power output with a first power stage;
      coupling the first power output to the testing stage;
      generating a first single mode current error signal based on a first measured load current, which is indicative of the current supplied by the first power output;
      coupling the first single mode current error signal to an input of a first single mode voltage control circuit;
      generating a first single mode voltage error signal using the first single mode voltage control circuit; and
      controlling the first power output based on the first single mode voltage error signal; and
   when the dual power mode is selected:
      producing a first power output with a first power stage;
      producing a second power output with a second power stage;
      coupling the first and second power outputs together and to the testing stage;
      generating a dual mode current error signal based on one of the first measured load current and a second measured load current, which is indicative of the current supplied by the second power output;
      coupling the dual mode current error signal to an input of a dual mode voltage control circuit;
      generating a dual mode voltage error signal using the dual mode voltage control circuit; and
      controlling the first and second power outputs based on the dual mode voltage error signal.

10. The method of claim 9, wherein:
    the first power stage comprises a first pulse width modulator controller having a first error input, the first pulse width modulator controller configured to produce a first control signal in response to a signal received at the first error input; and a first pulse width modulator configured to produce the first power output in response to the first control signal;
    the second power stage comprises a second pulse width modulator controller having a second error input, wherein the second pulse width modulator controller is configured to produce a second control signal in response to a signal received at the second error input; and a second pulse width modulator configured to produce the second power output in response to the second control signal; and
    the method further comprising steps of:
       routing the single mode voltage error signal to the first error input when the single power mode is selected; and
       routing the dual mode voltage error signal to the first and second error inputs when the dual power mode is selected.

11. The method of claim 10 further comprising using a multiplexor to perform the routing steps.

12. The method of claim 9, wherein the generating a single mode voltage error signal further comprises:
    obtaining a first measured load voltage, which is indicative of a voltage at the first power output; and
    generating the single mode voltage error signal based on the first measured load voltage.

13. The method of claim 9, wherein the generating a dual mode voltage error signal further comprises:
    obtaining one of the first measured load voltage and a second measured load voltage, which is indicative of a voltage at the second power output; and
    generating the dual mode voltage error signal based on one of the first measured load voltage and the second measured load voltage.

14. The method of claim 9, wherein:
    when the single power mode is selected:
       producing the second power output with the second power stage;
       coupling the first power output to a first testing stage power input;

coupling the second power output to a second testing stage power input;
generating a second single mode current error signal based on the second measured load current;
coupling the second single mode current error signal to an input of a second single mode voltage control circuit;

generating a second single mode voltage error signal using the second single mode voltage control circuit; and controlling the second power output based on the second single mode voltage error signal.

* * * * *